United States Patent
Zhou et al.

(10) Patent No.: US 12,293,083 B2
(45) Date of Patent: May 6, 2025

(54) WRITING AND READING METHOD, PROCESSOR CHIP, STORAGE MEDIUM AND ELECTRONIC DEVICE

(71) Applicant: SANECHIPS TECHNOLOGY CO., LTD., Guangdong (CN)

(72) Inventors: Yijun Zhou, Guangdong (CN); Hengqi Liu, Guangdong (CN); Jinlin Xu, Guangdong (CN); Feng Zhou, Guangdong (CN)

(73) Assignee: SANECHIPS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 18/018,566

(22) PCT Filed: Jul. 5, 2021

(86) PCT No.: PCT/CN2021/104489
§ 371 (c)(1),
(2) Date: Jan. 29, 2023

(87) PCT Pub. No.: WO2022/022231
PCT Pub. Date: Feb. 3, 2022

(65) Prior Publication Data
US 2023/0305710 A1    Sep. 28, 2023

(30) Foreign Application Priority Data
Jul. 31, 2020 (CN) .......................... 202010762798.9

(51) Int. Cl.
*G06F 3/06* (2006.01)
(52) U.S. Cl.
CPC .......... *G06F 3/0613* (2013.01); *G06F 3/0631* (2013.01); *G06F 3/0673* (2013.01)
(58) Field of Classification Search
None
See application file for complete search history.

(56) References Cited

U.S. PATENT DOCUMENTS

| | | | |
|---|---|---|---|
| 6,023,780 A * | 2/2000 | Iwatani | G06F 11/1076 714/6.24 |
| 9,001,611 B1 * | 4/2015 | Wu | G11C 7/18 365/230.06 |

(Continued)

FOREIGN PATENT DOCUMENTS

| | | |
|---|---|---|
| CN | 106250321 A | 12/2016 |
| EP | 2132636 B1 | 10/2014 |

OTHER PUBLICATIONS

China Patent Office, CN202010762798.9 First Office Action issued on May 31, 2024.

(Continued)

*Primary Examiner* — Yaima Rigol
(74) *Attorney, Agent, or Firm* — Li & Cai Intellectual Property (USA) Office (57) ABSTRACT

The present disclosure provides a writing method, including: writing writing-table data into a corresponding main storage module; performing a calculation on writing-table data in each target main storage module by using a first predetermined algorithm to obtain an auxiliary value, for any target main storage module, the first predetermined algorithm being used for performing a calculation on writing-table data stored in the target main storage module and corresponding writing-table data stored in at least one main storage module other than the target main storage module, an inverse operation of the first predetermined algorithm being used for performing a calculation on any auxiliary value to obtain writing-table data participating in the calculation of the auxiliary value; and storing the auxiliary value into a corresponding auxiliary storage module. The present disclosure further provides a reading method, a computer readable storage medium, a processor chip and an electronic device.

17 Claims, 6 Drawing Sheets

(56) References Cited

U.S. PATENT DOCUMENTS

| | | |
|---|---|---|
| 11,907,532 B1* | 2/2024 | Hua ................. G06F 3/061 |
| 2010/0199126 A1 | 8/2010 | Noguchi |
| 2011/0302376 A1 | 12/2011 | Zhou |
| 2015/0095860 A1* | 4/2015 | Satou ............... G06F 30/34 |
| | | 716/103 |
| 2015/0293854 A1* | 10/2015 | Kalamatianos .... G11C 29/4401 |
| | | 714/723 |
| 2019/0146717 A1 | 5/2019 | Khan |
| 2020/0012704 A1* | 1/2020 | Zhang ............... G06F 17/16 |

OTHER PUBLICATIONS

European Patent Office, EP21850967.7 Extended European Search Report issued on Jul. 26, 2024.

* cited by examiner

WRITING AND READING METHOD, PROCESSOR CHIP, STORAGE MEDIUM AND ELECTRONIC DEVICE

CROSS-REFERENCE TO RELATED APPLICATIONS

The present application claims priority to the Chinese Patent Application No. 202010762798.9 filed on Jul. 31, 2020, the entire contents of which are incorporated herein by reference.

TECHNICAL FIELD

The present disclosure relates to the field of storage devices, and in particular, to a writing method for writing data into a storage device, a reading method for reading data from a storage device, a processor chip, a computer-readable storage medium, and an electronic device.

BACKGROUND

With increasing expectations of society on a quantity of interactive data and an interactive speed during information interaction, a relatively small volume and a relatively high performance become important indexes for evaluating a network device. Accordingly, a processor chip in the network device is also pursuing a relatively small volume and a relatively high performance.

Taking a random-access memory (RAM) in the processor chip as an example, in a case where the RAM is provided with only one reading port, the performance of table lookup can only reach one wire speed due to a limitation of a bandwidth of the RAM, i.e., a storage value stored in one address can only be read in each clock cycle, which limits the performance of the processor chip.

SUMMARY

As a first aspect of the present disclosure, there is provided a writing method for writing data into a storage device, the storage device includes a plurality of storage modules including multiple main storage modules and at least one auxiliary storage module, the main storage modules include at least one target main storage module, each target main storage module corresponds to the auxiliary storage module, and the method includes: writing writing-table data, to be written, into corresponding main storage modules; performing a calculation on writing-table data in each target main storage module by using a first predetermined algorithm to obtain an auxiliary value, and for any target main storage module, the first predetermined algorithm being used for performing a calculation on writing-table data stored in the target main storage module and corresponding writing-table data stored in at least one of the main storage modules other than the target main storage module, and an inverse operation of the first predetermined algorithm being used for performing a calculation on any auxiliary value to obtain writing-table data participating in the calculation; and storing the auxiliary value into the auxiliary storage module corresponding thereto.

As a second aspect of the present disclosure, there is provided a reading method for reading data from a storage device, the storage device includes a plurality of storage modules including multiple main storage modules and at least one auxiliary storage module, the main storage modules include at least one target main storage module, each target main storage module corresponds to the auxiliary storage module, the storage device stores therein data written according to the writing method provided in the first aspect of the present disclosure, the reading method includes: receiving at least one reading instruction; determining a position of writing-table data to be read according to the reading instruction; in response to that data to be read by at least two reading instructions are stored in the same main storage module, and addresses pointed by the reading instructions correspond to auxiliary values, for the at least two reading instructions, the reading method further includes: for one of the at least two reading instructions, directly reading corresponding writing-table data from the main storage module; for any other instruction of the at least two reading instructions, respectively reading the auxiliary value stored in a corresponding address in the auxiliary storage module corresponding to the main storage module and writing-table data in corresponding addresses in main storage modules participating in a calculation of the auxiliary value; and performing a calculation on each auxiliary value by using a second predetermined algorithm and each writing-table data to obtain writing-table data stored in an address corresponding to the other instruction in the main storage module, the second predetermined algorithm being an inverse operation of a first predetermined algorithm.

As a third aspect of the present disclosure, there is provided a computer-readable storage medium having stored an executable program thereon, the executable program, when executed by a processor, causes the processor to implement at least one of the writing method provided in the first aspect of the present disclosure or the reading method provided in the second aspect of the present disclosure.

As a fourth aspect of the present disclosure, there is provided a processor chip, including: a storage device having at least one writing port and multiple reading ports, and a calculation module; the storage device includes a plurality of storage modules including a first writing port, multiple first reading ports, multiple main storage modules, and at least one auxiliary storage module, each auxiliary storage module corresponds to a predetermined number of main storage modules, each main storage module corresponds to at least one auxiliary storage module, and each storage module is provided with one reading port and one writing port; the calculation module includes a storage component and a processing component, the storage component having stored an executable program thereon, the executable program, when executed by the processing component, causes the processing component to implement the writing method provided in the first aspect of the present disclosure or the reading method provided in the second aspect in the present disclosure.

As a fifth aspect of the present disclosure, there is provided an electronic device including the processor chip provided in the present disclosure.

DETAILED DESCRIPTION

In order to make those skilled in the art better understand technical solutions of the present disclosure, a writing method for writing data into a storage device, a reading method for reading data from a storage device, a storage module, a computer-readable storage medium and an electronic device according to the present disclosure are further described in detail below with reference to the accompanying drawings.

Exemplary implementations are described in detail below with reference to the accompanying drawings, but may be implemented in different forms, and should not be construed as a limitation. The implementations are illustrated merely for those skilled in the art fully understanding the scope of the present disclosure.

The implementations of the present disclosure and the technical features in the implementations may be combined with each other if no conflict is incurred.

As used herein, a term "and/or" includes any and all combinations of one or more of listed items.

The terms used in the present disclosure are for a purpose of describing particular implementations only, but are not intended to limit the present disclosure. As used in the present disclosure, singular forms "a" and "the" are intended to include plural forms as well, i.e., to represent at least one, unless the context clearly defines otherwise. It should further be understood that terms "includes/comprises" and/or "made of/formed of" in the present disclosure are used to specify a presence of at least one of recited features, integers, steps, operations, elements or components, but do not preclude a presence or an addition of at least one of other features, integers, steps, operations, elements, components or groups thereof.

Unless otherwise defined, meanings of all terms (including technical terms and scientific terms) used herein are the same as meanings commonly understood by one of ordinary skill in the art. It should further be understood that terms, such as those defined in common dictionaries, should be construed as having a meaning that is consistent with that in background of the existing art and the present disclosure, and should not be construed as having an idealized or over-formal meaning, unless expressly defined in the present disclosure.

Any storage device mentioned in the present disclosure includes a plurality of storage modules including at least two types of storage modules, i.e., a main storage module and an auxiliary storage module. Each auxiliary storage module corresponds to a predetermined number of main storage modules, and each main storage module corresponds to at least one auxiliary storage module.

Figure 1:
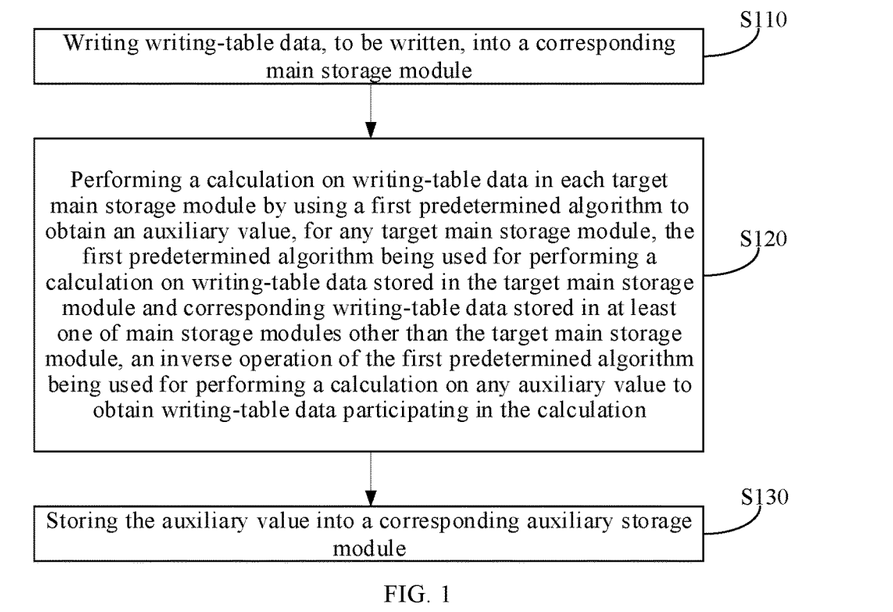
FIG. 1 is a flow chart of an implementation of a writing method according to a first aspect of the present disclosure.

In a first aspect of the present disclosure, there is provided a writing method for writing data into a storage device, as shown in FIG. 1, the method including following operations S110 to S130.

At operation S110, writing writing-table data, to be written, into a corresponding main storage module.

At operation S120, performing a calculation on writing-table data in each target main storage module by using a first predetermined algorithm to obtain an auxiliary value, and for any target main storage module, the first predetermined algorithm being used for performing a calculation on writing-table data stored in the target main storage module and corresponding writing-table data stored in at least one of the main storage modules other than the target main storage module, and an inverse operation of the first predetermined algorithm being used for performing a calculation on any auxiliary value to obtain writing-table data participating in the calculation.

At operation S130, storing the auxiliary value into a corresponding auxiliary storage module.

It should be noted that, in the present disclosure, the main storage module is configured to store writing-table data, and the auxiliary storage module is configured to store the auxiliary value.

In the present disclosure, for each writing-table data written into the main storage module, the writing-table data is not only directly stored in a target address in the target main storage module, but also stored in another form (i.e., a result obtained after the calculation by using the first predetermined algorithm) into the auxiliary storage module. If multiple reading instructions for reading the same main storage module are received simultaneously, one of the reading instructions may be controlled to directly read corresponding data in the auxiliary storage module, and then an inverse operation of the first predetermined algorithm is performed on writing-table data participating in the calculation of the corresponding data but other than writing-table data stored in the main storage module corresponding to the reading instruction, so that data expected to be read by the reading instruction can be obtained. Therefore, with the writing method provided in the present disclosure in corporation with a corresponding reading method, data in the storage device can be read at multi-wire speed.

It should be noted that, for any storage module, only one reading instruction can access the storage module in each clock cycle, and for the storage device, multiple reading instructions are allowed to respectively access different storage modules in each clock cycle.

In the present disclosure, the "corresponding writing-table data" are not limited, as long as it is possible to determine that writing-table data in which address participates in calculating the auxiliary value corresponding to writing-table data to be read, in subsequent reading of the writing-table data to be read stored in the main storage module. For example, a storage address of the "corresponding writing-table data" in the main storage module, to which the "corresponding writing-table data" belongs, is same as an address of the "writing-table data to be written" to be written.

In the present disclosure, each auxiliary value is a calculation result after performing the calculation by using the first predetermined algorithm on pieces of writing-table data already stored in the storage device. Therefore, for any writing-table data (which may be referred to as writing-table data A for convenience of description), the writing-table data A can be obtained by performing an inverse operation of the first predetermined algorithm, on a premise that the inverse operation of the first predetermined algorithm and other writing-table data participating in the calculation together with the writing-table data A are known.

Therefore, on a premise of receiving two reading instructions for respectively reading data in different addresses in the same main storage module, corresponding writing-table data in the storage module corresponding to one reading instruction may be directly read from the main storage module, and writing-table data expected to be read by the other reading instruction may be obtained by reading the auxiliary value, corresponding to an address pointed by the other reading instruction, stored in the auxiliary storage module and data in other main storage modules participating in the calculation of the auxiliary value, and performing the inverse operation of the first predetermined algorithm.

For example, two reading instructions are received to access the main storage module numbered 0, one reading instruction is to read data stored in an address 1 in the main storage module numbered 0, and the other reading instruction is to read data stored in an address 2 in the main storage module numbered 0.

In this case, one reading instruction is controlled to directly read the data stored in the address 1 in the main storage module numbered 0, the other reading instruction reads the auxiliary value stored in an address, corresponding to the address 2, in the auxiliary storage module corresponding to the main storage module with numbered 0, and reads data, stored in corresponding addresses in other main storage modules, participating in the calculation of the auxiliary value, and then the inverse operation of the first predetermined algorithm is performed on the auxiliary value and the data used for obtaining the auxiliary value, so as to obtain the data stored in the address 2 in the main storage module numbered 0.

In the existing art, in order to increase speed of reading data, an additional storage module may be added on a basis of the original storage module of the processor chip. However, such manner often increases an area occupied by the storage device in the processor chip, and further increases a volume of the processor chip, which is not favorable for realizing miniaturization of the processor chip. For example, in order to make a RAM of the processor chip meet four-wire speed of table lookup, three RAMs having the same storage depth as the original RAM are expected to be added on a basis of the original RAM, and during writing data into the storage device, each piece of data is written into four RAMs respectively (i.e., one data is copied four times). Each RAM corresponds to one reading port (i.e., each RAM is a one-read and one-write (1r1w) RAM), so that the storage device including such four RAMs can achieve four-wire speed of table lookup.

In the present disclosure, in order to achieve four-wire speed of table lookup, writing-table data is not directly and simultaneously stored in the auxiliary storage module, but is subjected to a calculation by using the first predetermined algorithm and then stored in the auxiliary storage module. Each result of the calculation is related to data in multiple main storage modules, and by storing the auxiliary value, pieces of data of multiple addresses are stored in another form in one address, so that a storage space expected for backing up and storing the data in the multiple addresses is reduced. Obviously, in the writing method provided in the present disclosure, in order to implement reading by multi-wire speed, less storage space is used, which is beneficial to implement miniaturization and integration of the storage device and the chip including the storage device.

For example, each auxiliary value may be related to four pieces of writing-table data, which corresponds to that one address in the auxiliary storage module may store four pieces of writing-table data. In the existing art, four pieces of writing-table data are written into four addresses.

In the present disclosure, the number of the main storage modules participating in the calculation is not particularly limited, as long as an access with multi-wire speed can be realized for at least part of data stored in the storage module.

In order to improve processing power of a processor including the storage device, in some implementations, after all target main storage modules are subjected to the calculation by using the first predetermined algorithm, data stored in all main storage modules participate in the calculations. That is, all auxiliary values relate to the data stored in all main storage modules, and thus, for all storage modules, the access with multi-wire speed can be realized.

In the present disclosure, there is no particular limitation on which of the multiple reading instructions, accessing the same main storage module simultaneously, directly reads data in the main storage module. For example, the reading instruction that points to a smallest numbered address may read directly the data stored in the main storage module. For example, two reading instructions access the main storage module 1 simultaneously, one reads data in address 1, and the other reads data in address 2, then the reading instruction for reading the data in the address 1 directly reads the data stored in the main storage module. Certainly, the present disclosure is not limited thereto, and the reading instruction directly reading data may be randomly selected from the multiple reading instructions.

Data stored in each main storage module (which may be referred to as a non-target main storage module for convenience of description), which is not the target main storage module, participates in the calculation of the auxiliary value. Therefore, in a case where multiple reading instructions simultaneously read data stored in different addresses in one non-target main storage module, one reading instruction may read data stored in the non-target main storage module, another reading instruction reads the auxiliary value as a result of a calculation participated by the data stored in an address pointed by the another reading instruction, the data in the target main storage module participating in the calculation of the auxiliary value, and the data stored in other non-target main storage modules participating in the calculation of the auxiliary value, and an inverse operation of the first predetermined algorithm is performed by using the auxiliary value and the above data, so that data stored in the address pointed by the another reading instruction can be obtained.

Figure 2:
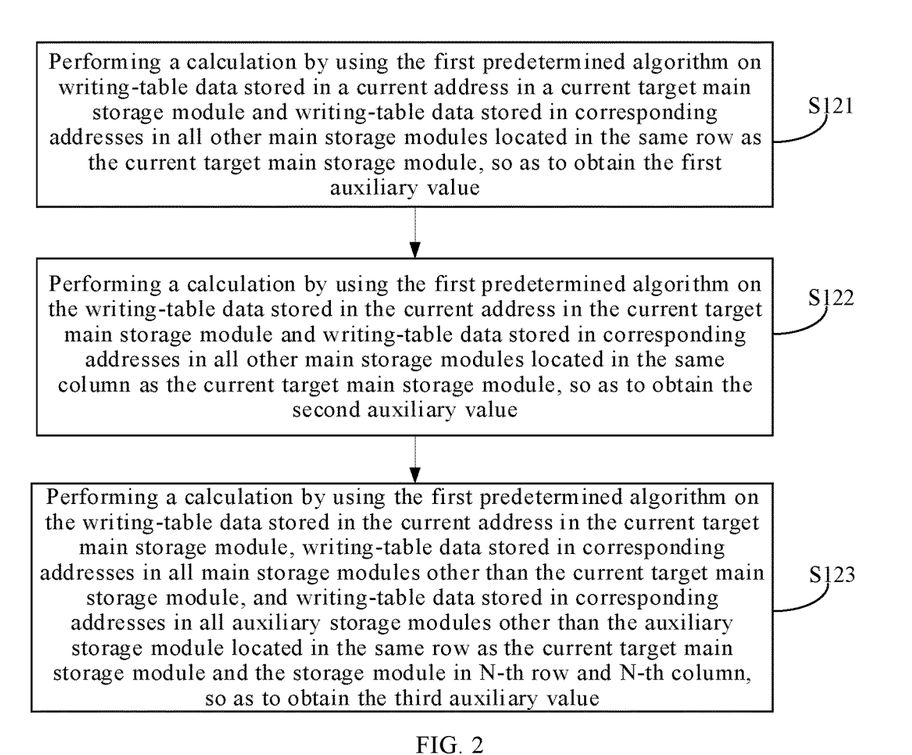
FIG. 2 is a flow chart of an implementation of operation S120.

In the present disclosure, a specific form and a specific structure of the storage device are not particularly limited thereto. In some implementations, the main storage modules are formed as an N×N array, and for the storage modules in previous (N−1) rows, the storage modules in each row include N main storage modules and one auxiliary storage module, the storage modules in $N^{th}$ row include N auxiliary storage modules, N is a positive integer not less than 3. Accordingly, the auxiliary value includes a first auxiliary value, a second auxiliary value and a third auxiliary value In operation S120 of performing the calculation on writing-table data in each target main storage module by using the first predetermined algorithm to obtain the auxiliary value, as shown in FIG. 2, for writing-table data stored in any address (hereinafter referred to as a current address) of any target main storage module (hereinafter referred to as a current target main storage module), the operation to obtain the auxiliary value includes following operations S121 to S123.

At operation S121, performing a calculation by using the first predetermined algorithm on writing-table data stored in a current address in a current target main storage module and writing-table data stored in corresponding addresses in all other main storage modules located in the same row as the current target main storage module, so as to obtain the first auxiliary value.

At operation S122, performing a calculation by using the first predetermined algorithm on the writing-table data stored in the current address in the current target main storage module and writing-table data stored in corresponding addresses in all other main storage modules located in the same column as the current target main storage module, so as to obtain the second auxiliary value.

At operation S123, performing a calculation by using the first predetermined algorithm on the writing-table data stored in the current address in the current target main storage module, writing-table data stored in corresponding addresses in all main storage modules other than the current target main storage module, and writing-table data stored in corresponding addresses in all auxiliary storage modules, other than the auxiliary storage module located in the same row as the current target main storage module and the storage module in $N^{th}$ row and $N^{th}$ column, so as to obtain the third auxiliary value.

The first auxiliary value is stored in the auxiliary storage module located in the same row as the current target main storage module, and the second auxiliary value is stored in the auxiliary storage module located in the same column as the current target main storage module, the third auxiliary value is stored in the storage module (it is easy to understand that the storage module is an auxiliary storage module) in $N^{th}$ row and $N^{th}$ column.

The above implementations support a case where four reading instructions access the same main storage module simultaneously. That is, one of the four reading instructions directly accesses the corresponding main storage module, and in order to obtain data expected to be read by the remaining three reading instructions, the corresponding first auxiliary value, writing-table data of other main storage modules participating in the calculation of the first auxiliary value, the corresponding second auxiliary value, writing-table data of other main storage modules participating in the calculation of the second auxiliary value, the corresponding third auxiliary value, writing-table data of other main storage modules participating in the calculation of the third auxiliary value, and data stored in the auxiliary storage modules participating in the calculation of the third auxiliary value may be read, respectively. Then, corresponding inverse operation is performed, and data expected to be read by the remaining three reading instructions can be obtained.

In the present disclosure, a location of the target main storage module in the storage device is not particularly limited. For convenience of calculation, in some implementations, in the N×N array, previous (N−1) main storage modules in a first row may be considered as target main storage modules, and previous (N−1) main storage modules in a first column may be considered as target main storage modules.

In the present disclosure, the "corresponding address" is not particularly limited. In some implementations, the "corresponding address" may be an address satisfying a specific mapping relationship with an address where writing-table data to be calculated is stored, or may be an address whose identification information is the same as that of the writing-table data to be calculated. In some implementations, the "identification information" of the address may be a number of the address in the corresponding storage module.

For convenience of calculation, in some implementations, identification information of addresses corresponding to all writing-table data participating in the same calculation using the first predetermined algorithm are the same.

In the present disclosure, a numerical value of N is not particularly limited. In some implementations, N may be equal to 5. The writing method provided in the present disclosure is described in detail below by taking a case where N is equal to 5 as an example.

Figure 3:
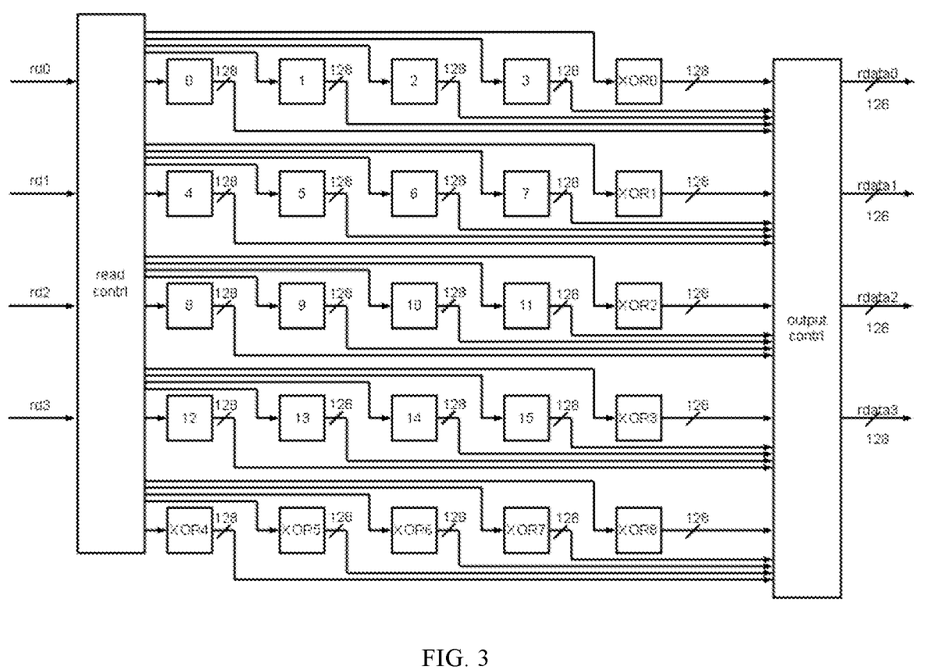
FIG. 3 is a schematic diagram of an implementation of a storage device.

As shown in FIG. 3, the storage device includes sixteen main storage modules and nine auxiliary storage modules, which are arranged in a 5×5 array. The sixteen main storage modules include a main storage module 0, a main storage module 1, a main storage module 2, a main storage module 3, a main storage module 4, a main storage module 5, a main storage module 6, a main storage module 7, a main storage module 8, a main storage module 9, a main storage module 10, a main storage module 11, a main storage module 12, a main storage module 13, a main storage module 14 and a main storage module 15. The nine auxiliary storage modules include an auxiliary storage module XOR0, an auxiliary storage module XOR1, an auxiliary storage module XOR2, an auxiliary storage module XOR3, an auxiliary storage module XOR4, an auxiliary storage module XOR5, an auxiliary storage module XOR6, an auxiliary storage module XOR7, and an auxiliary storage module XOR 8.

In the array, the main storage module 0, the main storage module 1, the main storage module 2, the main storage module 3 and the auxiliary storage module XOR0 are located in a first row; the main storage module 4, the main storage module 5, the main storage module 6, the main storage module 7, and the auxiliary storage module XOR1 are located in a second row; the main storage module 8, the main storage module 9, the main storage module 10, the main storage module 11, and the auxiliary storage module XOR2 are located in a third row; the main storage module 12, the main storage module 13, the main storage module 14, the main storage module 15, and the auxiliary storage module XOR3 are located in a fourth row; the auxiliary storage module XOR4, the auxiliary storage module XOR5, the auxiliary storage module XOR6, the auxiliary storage module XOR7, and the auxiliary storage module XOR8 are located in a fifth row.

In some implementations, both the main storage module and the auxiliary storage module may be RAMs. Certainly, the main storage module and the auxiliary storage module may also be storage devices in other forms.

In the implementations, the main storage modules (which include the main storage module 0, the main storage module 1, the main storage module 2 and the main storage module 3) in the first row and the main storage modules (which include the main storage module 0, the main storage module 4, the main storage module 8 and the main storage module 12) in the first column are target main storage modules.

The writing method includes three stages, i.e., a stage of writing writing-table data (corresponding to operation S110), a stage of calculating the auxiliary value (corresponding to operation S120), and a stage of writing the auxiliary value (corresponding to operation S130).

In the stage of writing the writing-table data, data to be written is written into a corresponding address in the corresponding main storage module (which may be the target main storage module or not).

The stage of calculating the auxiliary value and the stage of writing the auxiliary value are described in detail below by taking a first auxiliary value corresponding to an address 0 #in each storage module as an example.

A calculation is performed on writing-table data in address 0 #in the main storage module 0 and in addresses 0 #in other main storage modules (including address 0 #in the main storage module 1, address 0 #in the main storage module 2, and address 0 #in the main storage module 3) in the same row as the main storage module 0 by using the first predetermined algorithm, so as to obtain the first auxiliary value corresponding to the address 0 #in the main storage module 0, and then the first auxiliary value is stored in address 0 #in the auxiliary storage module XOR0.

A calculation is performed on writing-table data in the address 0 #in the main storage module 1 and in addresses 0 #in other main storage modules (including the address 0 #in the main storage module 0, the address 0 #in the main storage module 2, and the address 0 #in the main storage module 3) in the same row as the main storage module 1 by using the first predetermined algorithm, so as to obtain the first auxiliary value corresponding to the address 0 #in the main storage module 1, and then the first auxiliary value is stored in address 0 #in the auxiliary storage module XOR1.

A calculation is performed on writing-table data in the address 0 #in the main storage module 2 and in addresses 0 #in other main storage modules (including the address 0 #in the main storage module 0, the address 0 #in the main storage module 1, and the address 0 #in the main storage module 3) in the same row as the main storage module 2 by using the first predetermined algorithm, so as to obtain the first auxiliary value corresponding to the address 0 #in the main storage module 2, and then the first auxiliary value is stored in address 0 #in the auxiliary storage module XOR2.

A calculation is performed on writing-table data in the address 0 #in the main storage module 3 and in addresses 0 #in other main storage modules (including the address 0 #in the main storage module 0, the address 0 #in the main storage module 1, and the address 0 #in the main storage module 2) in the same row as the main storage module 3 by using the first predetermined algorithm, so as to obtain the first auxiliary value corresponding to the address 0 #in the main storage module 3, and then the first auxiliary value is stored in address 0 #in the auxiliary storage module XOR3.

The stage of calculating the auxiliary value and the stage of writing the auxiliary value are described in detail below by taking a second auxiliary value corresponding to an address 0 #in each storage module as an example.

A calculation is performed on writing-table data in the address 0 #in the main storage module 0 and in addresses 0 #in other main storage modules (including address 0 #in the main storage module 4, address 0 #in the main storage module 8, and address 0 #in the main storage module 12) in the same column as the main storage module 0 by using the first predetermined algorithm, so as to obtain the second auxiliary value corresponding to the address 0 #in the main storage module 0, and then the second auxiliary value is stored in address 0 #in the auxiliary storage module XOR4.

A calculation is performed on writing-table data in the address 0 #in the main storage module 4 and in addresses 0 #in other main storage modules (including the address 0 #in the main storage module 0, the address 0 #in the main storage module 8, and the address 0 #in the main storage module 12) in the same column as the main storage module 4 by using the first predetermined algorithm, so as to obtain the second auxiliary value corresponding to the address 0 #in the main storage module 4, and then the second auxiliary value is stored in address 0 #in the auxiliary storage module XOR5.

A calculation is performed on writing-table data in the address 0 #in the main storage module 8 and in addresses 0 #in other main storage modules (including the address 0 #in the main storage module 0, the address 0 #in the main storage module 4, and the address 0 #in the main storage module 12) in the same column as the main storage module 8 by using the first predetermined algorithm, so as to obtain the second auxiliary value corresponding to the address 0 #in the main storage module 8, and then the second auxiliary value is stored in address 0 #in the auxiliary storage module XOR6.

A calculation is performed on writing-table data in the address 0 #in the main storage module 12 and data in addresses 0 #in other main storage modules (including the address 0 #in the main storage module 0, the address 0 #in the main storage module 4, and the address 0 #in the main storage module 8) in the same column as the main storage module 12 by using the first predetermined algorithm, so as to obtain the second auxiliary value corresponding to the address 0 #in the main storage module 12, and then the second auxiliary value is stored in address 0 #in the auxiliary storage module XOR7.

The stage of calculating the auxiliary value and the stage of writing the auxiliary value are described in detail below by taking a third auxiliary value corresponding to an address 0 #in each storage module as an example.

A calculation is performed on writing-table data in the address 0 #in the main storage module 0 and in addresses 0 #(including address 0 #in the main storage module 5, address 0 #in the main storage module 6, and address 0 #in the main storage module 7, address 0 #in the main storage module 9, address 0 #in the main storage module 10, address 0 #in the main storage module 11, address 0 #in the main storage module 13, address 0 #in the main storage module 14, and address 0 #in the main storage module 15) in the main storage modules other than the target main storage modules, and writing-table data in addresses 0 #(including address 0 #in the auxiliary storage module 1, address 0 #in the auxiliary storage module 2, address 0 #in the auxiliary storage module 3, address 0 #in the auxiliary storage module 5, address 0 #in the auxiliary storage module 6, and address 0 #in the auxiliary storage module 7) in all auxiliary storage modules other than the auxiliary storage module corresponding to the current target main storage module, by using the first predetermined algorithm, so as to obtain the third auxiliary value corresponding to the address 0 #in the main storage module 0, and then the third auxiliary value is stored in address 0 #in the auxiliary storage module XOR8.

Manners for calculating third auxiliary values corresponding to addresses in other main storage modules are similar to the manner for calculating the third auxiliary value corresponding to the address 0 #in the main storage module 0, and thus are not repeated here. Moreover, manners for calculating auxiliary values corresponding to other addresses are similar to the manner for calculating the auxiliary value corresponding to the address 0 #, and thus are not repeated here.

In the writing method mentioned above, the storage modules of the storage device are formed as a two-dimensional array, but in some implementations, the storage modules of the storage device may also be formed as a three-dimensional array.

Figure 4:
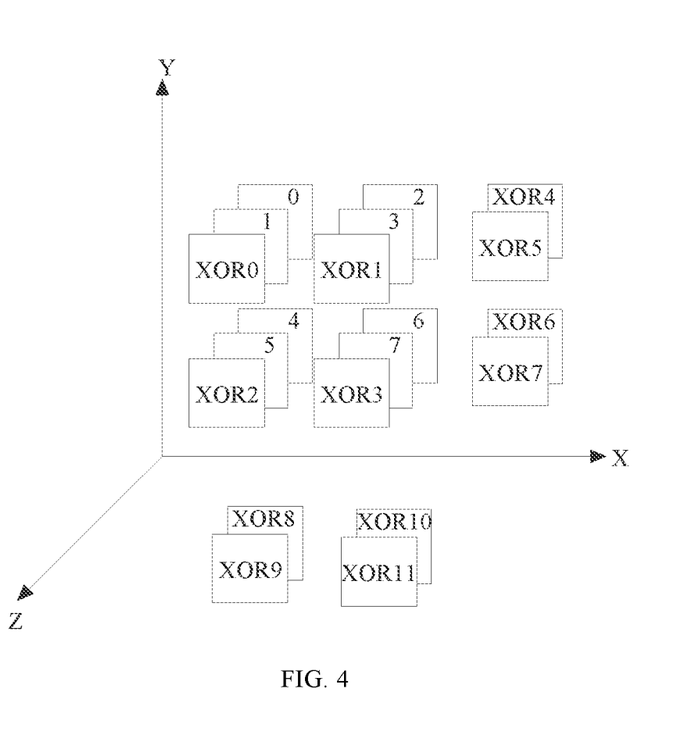
FIG. 4 is a schematic diagram of an implementation of a storage device.

Specifically, as shown in FIG. 4, the storage modules include multiple main storage modules formed as an M×M×M array and 3×M² auxiliary storage modules, from a perspective of each coordinate system plane, in an XY plane, the storage modules in each row include M main storage modules and one auxiliary storage module, in an XZ plane, the storage modules in each row include M main storage modules and one auxiliary storage module, and in a YZ plane, the storage modules in each row include M main storage modules and one auxiliary storage module, M is a positive integer not less than 1, the auxiliary value includes a first auxiliary value, a second auxiliary value, and a third auxiliary value.

In the operation of performing the calculation on writing-table data in each target main storage module by using the first predetermined algorithm to obtain the auxiliary value, for writing-table data stored in any address in any one of the target main storage modules, the operation to obtain the auxiliary value includes: performing a calculation by using the first predetermined algorithm on writing-table data stored in a current address in a current target main storage module and writing-table data stored in corresponding addresses in all other main storage modules located in the same row in the XY plane as the current target main storage module, so as to obtain the first auxiliary value; performing a calculation by using the first predetermined algorithm on the writing-table data stored in the current address in the current target main storage module and writing-table data stored in corresponding addresses in all other main storage modules located in the same row in the XZ plane as the current target main storage module, so as to obtain the second auxiliary value; and performing a calculation by using the first predetermined algorithm on the writing-table data stored in the current address in the current target main storage module and writing-table data stored in corresponding addresses in all other main storage modules located in the same row in the YZ plane as the current target main storage module, so as to obtain the third auxiliary value; the first auxiliary value is stored in the auxiliary storage module located in the same row in the XY plane as the current target main storage module, and the second auxiliary value is stored in the auxiliary storage module located in the same row in the XZ plane as the current target main storage module, and the third auxiliary value is stored in the auxiliary storage module located in the same row in the YZ plane as the current target main storage module.

In the implementation shown in FIG. 4, M is equal to 2, and the storage device includes eight main storage modules and twelve auxiliary storage modules. The eight main storage modules are arranged as a three-dimensional array of 2×2×2, and the eight main storage modules include a main storage module 0, a main storage module 1, a main storage module 2, a main storage module 3, a main storage module 4, a main storage module 5, a main storage module 6, a main storage module 7; the twelve auxiliary storage modules include an auxiliary storage module XOR0, an auxiliary storage module XOR1, an auxiliary storage module XOR2, an auxiliary storage module XOR3, an auxiliary storage module XOR4, an auxiliary storage module XOR5, an auxiliary storage module XOR6, an auxiliary storage module XOR7, an auxiliary storage module XOR8, an auxiliary storage module XOR9, an auxiliary storage module XOR10, and an auxiliary storage module XOR11.

In the present disclosure, the first predetermined algorithm is not particularly limited, as long as the first predetermined algorithm has an inverse operation. To simplify the operations of the calculation, in some implementations, the first predetermined algorithm is an exclusive OR operation.

It should be noted that an inverse operation of the exclusive OR operation is still the exclusive OR operation. For example, the exclusive OR operation by using A and B results in C, the exclusive OR operation by using B and C results in A, and the exclusive OR operation using A and C results in B.

Therefore, in a case where L pieces of writing-table data are subjected to the exclusive OR operation to obtain the auxiliary value, if (L−1) pieces of writing-table data and the auxiliary value are known, the (L−1) pieces of writing-table data and the auxiliary value are subjected to the exclusive OR operation to determine a value of the remaining writing-table data unknown.

Figure 5:
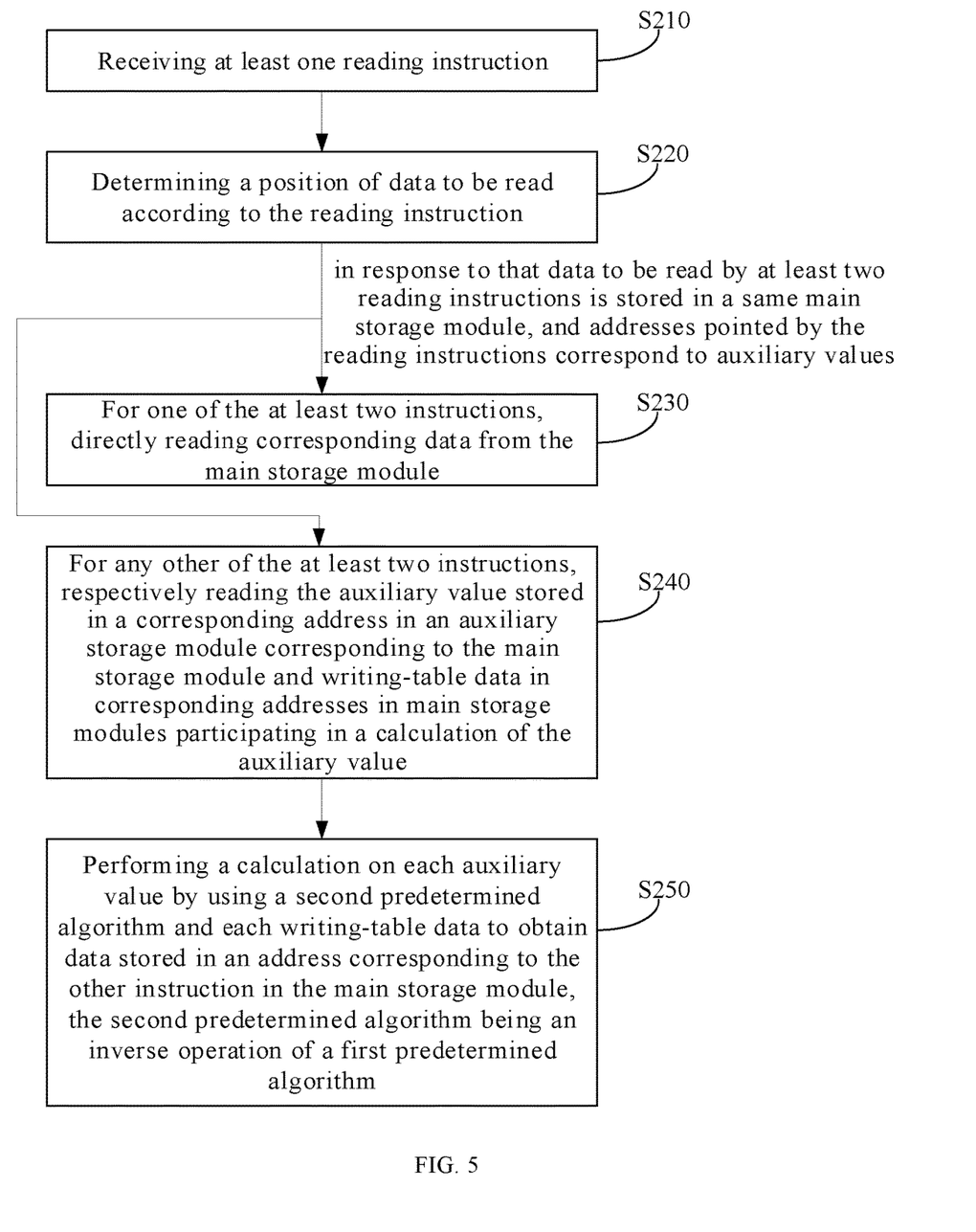
FIG. 5 is a flow chart of an implementation of a reading method according to a second aspect of the present disclosure.

In a second aspect of the present disclosure, there is provided a reading method for reading data from a storage device, the storage device includes a plurality of storage modules including multiple main storage modules and at least one auxiliary storage module, the main storage modules include at least one target main storage module, the storage device has stored therein data written according to the writing method provided in the first aspect of the present disclosure, and as shown in FIG. 5, the reading method includes following operations S210 to S250.

At operation S210, receiving at least one reading instruction.

At operation S220, determining a position of data to be read according to the reading instruction.

Taking a case where data to be read by at least two reading instructions is stored in the same main storage module and addresses pointed by the reading instructions correspond to auxiliary values as an example, following operations S230 to S250 are performed.

At operation S230, for one of the at least two instructions, directly reading corresponding data from the main storage module.

At operation S240, for any other of the at least two instructions, respectively reading an auxiliary value stored in a corresponding address in an auxiliary storage module corresponding to the main storage module and writing-table data in corresponding addresses in main storage modules participating in a calculation of the auxiliary value.

At operation S250, performing a calculation on each auxiliary value by using a second predetermined algorithm and each writing-table data to obtain data stored in an address corresponding to the other instruction in the main storage module, the second predetermined algorithm being an inverse operation of a first predetermined algorithm.

In each clock cycle, although two or more reading instructions are not allowed to access the same main storage module simultaneously, multiple reading instructions are allowed to access different main storage modules respectively. An execution basis of the reading method provided in the second aspect of the present disclosure includes: the writing-table data stored in the storage device is writing-table data written into the storage device by using the writing method provided in the first aspect of the present disclosure.

During writing the writing-table data, not only the writing-table data is written into a corresponding address in the main storage module, but also an auxiliary value obtained by performing a calculation on writing-table data stored in the current main storage module and writing-table data stored in corresponding addresses in other main storage modules is written into the auxiliary storage module, so that the writing-table data is stored in a form of the auxiliary value in corresponding addresses in other storage modules except "the corresponding address in the main storage module".

In the reading method provided in the second aspect of the present disclosure, after multiple reading instructions for accessing different addresses in the same main storage module are received, a storage address of data related to an auxiliary value in an address may be determined according to the address to be read by each reading instruction, and then the corresponding storage address is accessed, and data participating in a calculation of the auxiliary value can be obtained. If a calculation is performed on the auxiliary value and the data participating in the calculation of the auxiliary value by using the second predetermined algorithm, data stored in the address to be read by the reading instruction is obtained, thereby fast data reading (or referred to as fast table lookup) is realized.

In some implementations, the first predetermined algorithm is an exclusive OR operation and the second predetermined algorithm is an inverse operation of the exclusive OR operation.

It should be noted that the inverse operation of the exclusive OR operation is still the exclusive OR operation. For example, the exclusive OR operation by using A and B results in C, the exclusive OR operation by using B and C results in A, and the exclusive OR operation by using A and C results in B.

Specific implementations of operations S230 to S250 of the reading method in a case where the writing method includes operations S121 to S122 are described below.

Taking a case where four reading instructions (for convenience of description, the four reading instructions are respectively denoted as a first reading instruction, a second reading instruction, a third reading instruction, and a fourth reading instruction, it should be noted that "first", "second", "third", and "fourth" are only used to distinguish the four reading instructions, rather than limiting an order or priority of the four reading instructions) simultaneously access the same main storage module as an example, specific implementations of operations S230 to S250 are as follows.

The operation S230 may include: for the first reading instruction, reading directly data from an address, pointed by the first reading instruction, in a main storage module.

The operation S240 may include: for the second reading instruction, reading a first auxiliary value stored in a corresponding address (i.e., an address whose number is same as that of an address pointed by the second reading instruction) in an auxiliary storage module corresponding to the main storage module, and data in corresponding addresses in main storage modules participating in a calculation of the first auxiliary value; for the third reading instruction, reading a second auxiliary value stored in a corresponding address (i.e., an address whose number is same as that of an address pointed by the third reading instruction) of an auxiliary storage module corresponding to the main storage module, and data in corresponding addresses in main storage modules participating in a calculation of the second auxiliary value; for the fourth reading instruction, reading a third auxiliary value stored in a corresponding address (i.e., an address whose number is same as that of an address pointed by the fourth reading instruction) of an auxiliary storage module corresponding to the main storage module, and data in corresponding addresses in main storage modules participating in a calculation of the third auxiliary value.

The operation S250 may include: performing a calculation by using the second predetermined algorithm on the first auxiliary value and the data in the corresponding addresses in the main storage modules participating in the calculation of the first auxiliary value to obtain a value of data stored in the address pointed by the second reading instruction; performing a calculation by using the second predetermined algorithm on the second auxiliary value and the data in the corresponding addresses in the main storage modules participating in the calculation of the second auxiliary value to obtain a value of data stored in the address pointed by the third reading instruction; performing a calculation by using the second predetermined algorithm on the third auxiliary value and the data in the corresponding addresses in the main storage modules participating in the calculation of the third auxiliary value to obtain a value of data stored in the address pointed by the fourth reading instruction.

One RAM with a depth of 2048 and a bit width of 128 bits is illustrated below as a specific example, and in a relatively difficult situation of a read conflict of the RAM, i.e., a case where addresses of four reading instructions for table lookup are in the same 1r1w RAM, for example, four reading instructions for table lookup are to read values at addresses 0, 1, 126, 127 in the RAM0, respectively. A depth of each 1r1w RAM in the RAM0 to RAM15 is (2048/16=128), and then nine 1r1w RAMs each with a depth of 128 are used as XOR0 to XOR8, and a whole process of reading values by table lookup is as described in (1) to (4) below.

Figure 6:
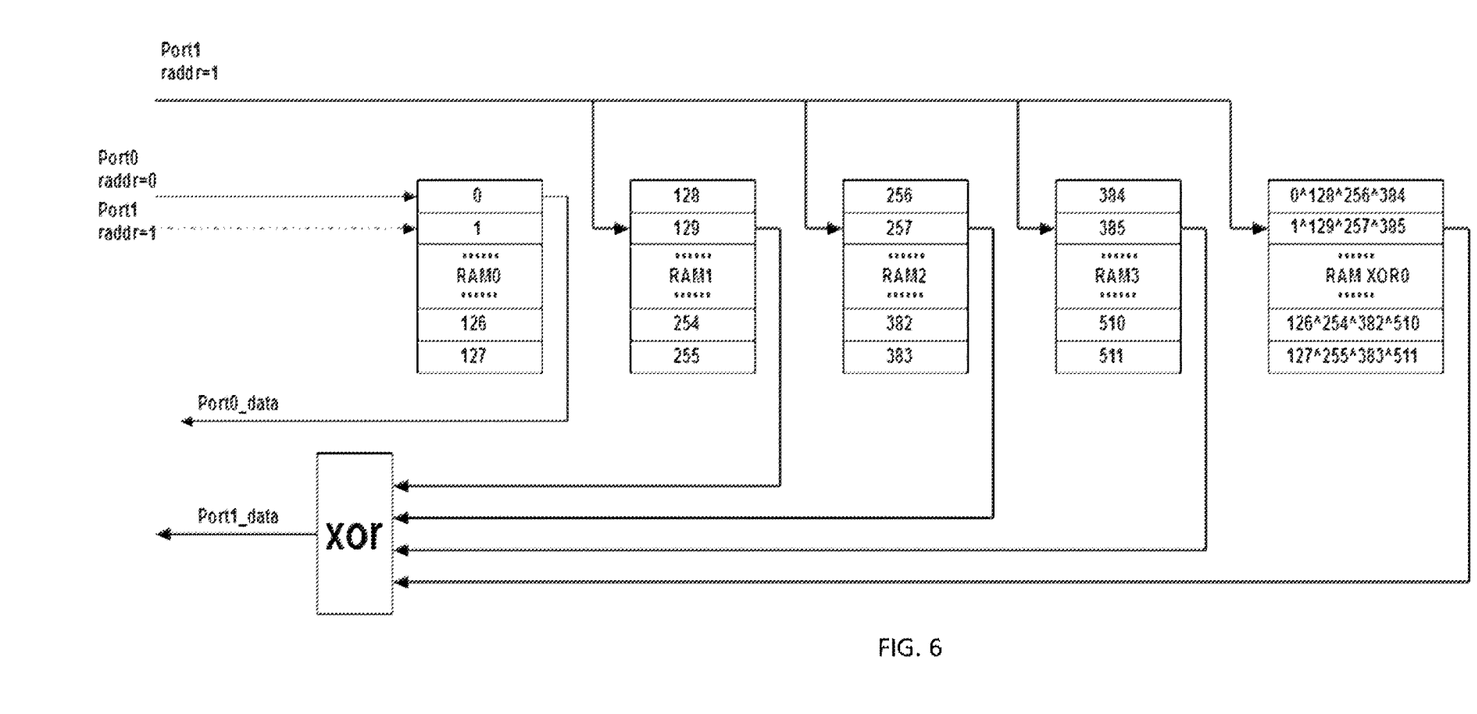
FIG. 6 is a logic diagram of obtaining a value of data stored in an address 1 of RAM0 in an implementation provided in the present disclosure.

(1) As shown in FIG. 6, a reading instruction from Port0 is to read a value of an address 0 in RAM0, the value is read directly, and returned.

(2) As shown in FIG. 6, a reading instruction from Port1 is to read a value of an address 1 in RAM0. If the address 1 in RAM0 is read directly, there is a read conflict with operation (1), which results in a significant return delay. Therefore, values of addresses 1 in RAM2, RAM3, RAM4, and XOR0 may be read (that is, four instructions with (raddr=1) are generated and sent to RAM2, RAM3, RAM4, and XOR0, respectively), and read values are subjected to an exclusive OR operation, so that the value of the address 1 in RAM0 is obtained and returned.

Figure 7:
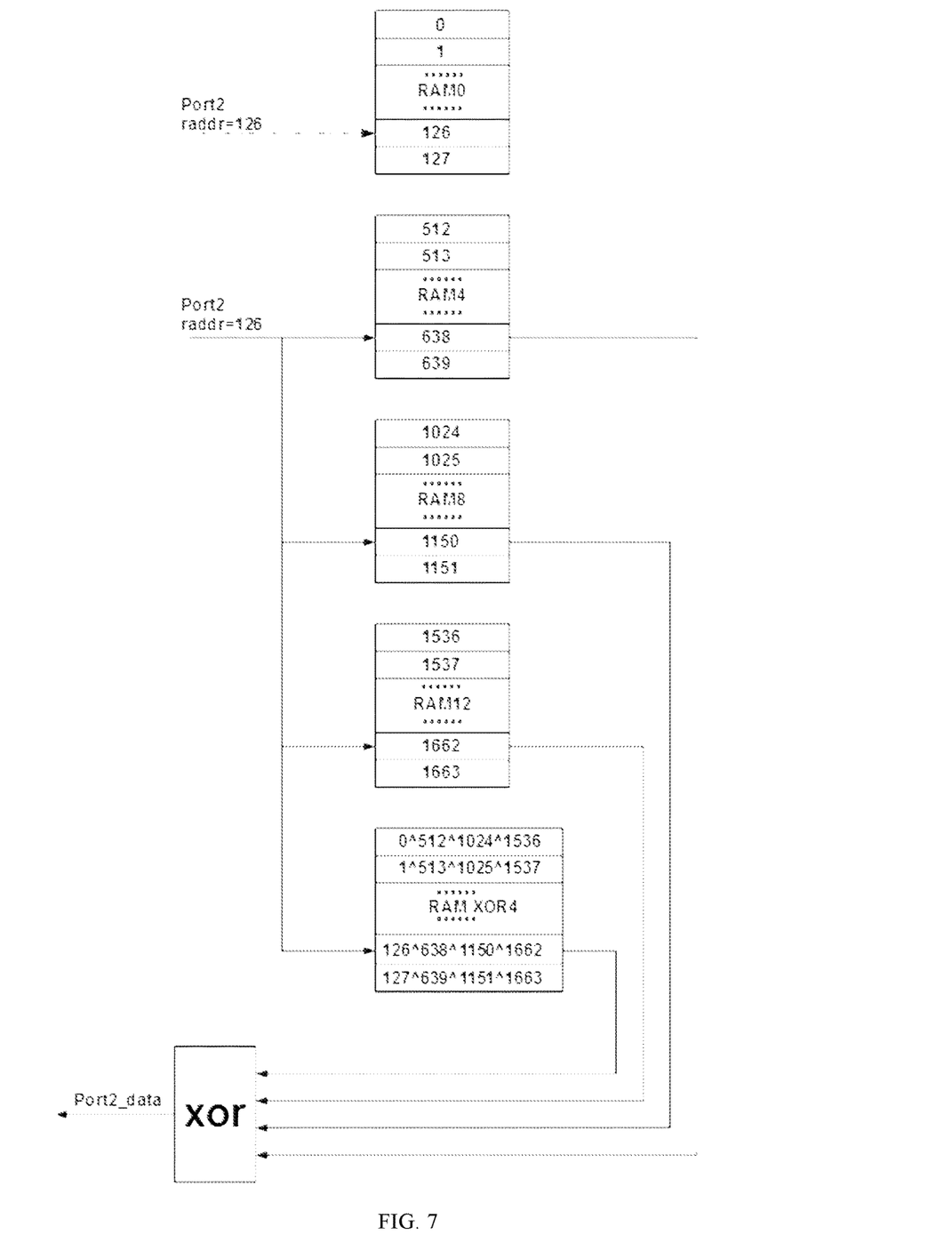
FIG. 7 is a logic diagram of obtaining a value of data stored in an address 2 of RAM0 in an implementation provided in the present disclosure.

(3) As shown in FIG. 7, a reading instruction from Port2 is to read an address 126 in RAM0. Similarly, if the address 126 in RAM0 is read directly, there is a read conflict with operation (1), which results in a significant return delay. Therefore, addresses 126 in RAM4, RAM8, RAM12, and XOR4 may be read (that is, four instructions with (raddr=126) are generated and sent to RAM4, RAM8, RAM12, and XOR4, respectively), and read values are subjected to an exclusive OR operation, so that the value of the address 126 in RAM0 is obtained and returned.

Figure 8:
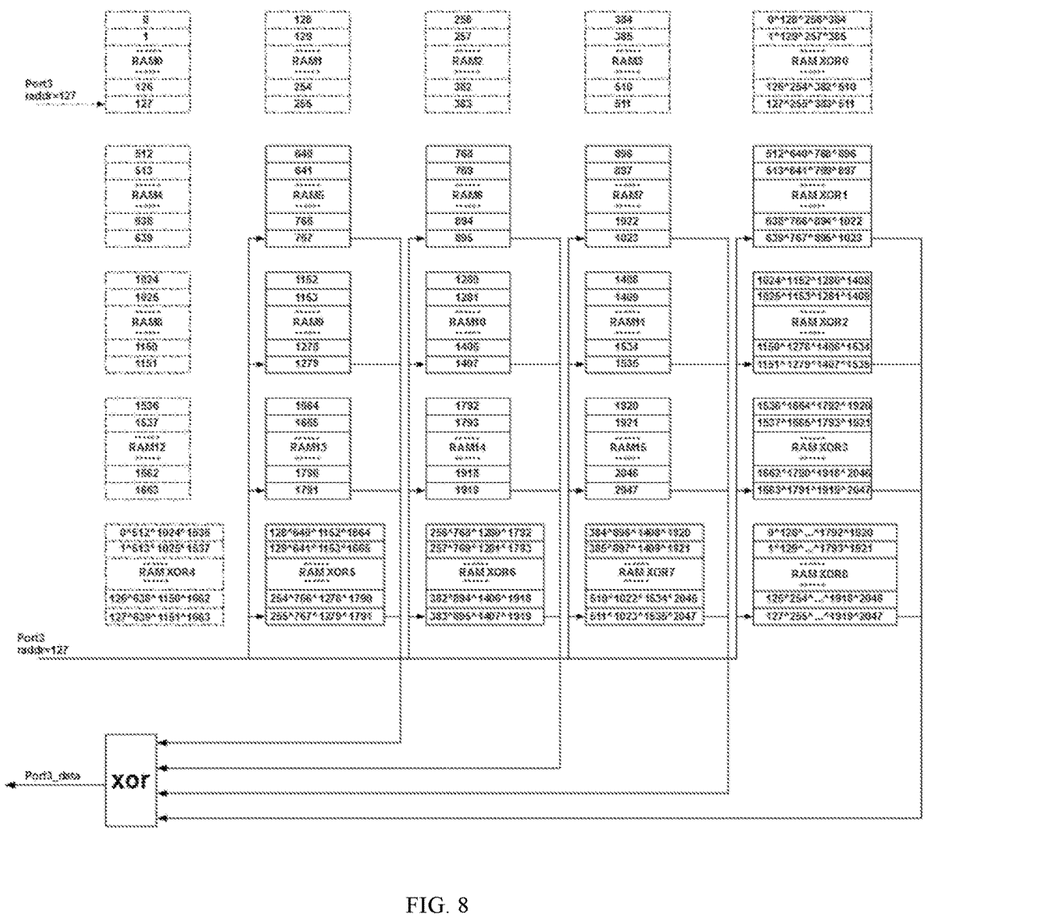
FIG. 8 is a logic diagram of obtaining a value of data stored in an address 3 of RAM0 in an implementation provided in the present disclosure.

(4) As shown in FIG. 8, a reading instruction from Port3 is to read an address 127 in RAM0. As for the same reason as above, the address 127 in RAM0 cannot be read directly, values of addresses 127 in remaining fifteen RAMs, i.e., RAM5, RAM6, RAM7, RAM9, RAM10, RAM11, RAM13, RAM14, RAM15, XOR1, XOR2, XOR3, XOR5, XOR6, and XOR7 (that is, fifteen instructions with (raddr=127) are generated and sent to RAM5, RAM6, RAM7, RAM9, RAM10, RAM11, RAM13, RAM14, RAM15, XOR1, XOR2, XOR3, XOR5, XOR6, and XOR7, respectively) are read, and read values are subjected to an exclusive OR operation, and the value of the address 126 in RAM0 is obtained and returned.

In a third aspect of the present disclosure, there is provided a computer-readable storage medium having stored an executable program (e.g., a computer program) thereon, the executable program, when executed by a processor, causes the processor to implement at least one of the writing method provided in the first aspect of the present disclosure or the reading method provided in the second aspect of the present disclosure.

In a fourth aspect of the present disclosure, there is provided a processor chip including a storage device and a calculation module.

The storage device includes a plurality of storage modules including multiple main storage modules and at least one auxiliary storage module, each auxiliary storage module corresponds to a predetermined number of main storage modules, and each main storage module corresponds to at least one the auxiliary storage module.

The calculation module includes a storage component and a processing component, the storage component stores an executable program thereon, the executable program, when executed by the processing component, causes the processing component to implement the writing method provided in the first aspect of the present disclosure or the reading method provided in the second aspect of the present disclosure.

The storage device is provided with at least one writing port and multiple reading ports, and each storage module is provided with one reading port and one writing port.

Therefore, the storage device can receive multiple reading instructions simultaneously.

In the present disclosure, each storage module may be a RAM, for example, each storage module may be a 1r1w RAM.

FIG. 3 is a schematic diagram of a processor chip, the processing component includes a writing component, a reading control component, and an output control component. The writing component is configured to write data into each storage module according to the writing method provided in the present disclosure. The reading control component is denoted by "read control" in FIG. 3, and is configured to allocate received reading instructions to obtain data according to the reading method provided in the present disclosure, that is, to determine which reading instruction to read directly data stored in a corresponding address, and which reading instruction to read a corresponding auxiliary value and data associated with the auxiliary value. In FIG. 3, rd0, rd1, rd2, and rd3 represent four different reading instructions, respectively.

The output control component is denoted by "output control" in FIG. 3, and is configured to control an output of data obtained for each reading instruction. In FIG. 3, rdata0, rdata1, rdata2, rdata3 are outputs corresponding to rd0, rd1, rd2, rd3, respectively.

In some implementations, a storage depth of the main storage module is same as a storage depth of the auxiliary storage module.

In some implementations, the main storage modules are formed into an N×N array, and for the storage modules in previous (N−1) rows, the storage modules in each row include N main storage modules and one auxiliary storage module, the storage modules in $N^{th}$ row include N auxiliary storage modules.

In some implementations, N is equal to 5, the storage device is provided with four reading ports, a storage depth of each main storage module is one-sixteenth of a total storage depth of all main storage modules.

In the present disclosure, the main storage modules may be obtained by dividing a RAM in the existing art into sixteen parts. Therefore, a storage space of the storage device provided in the present disclosure is increased by only 1.526 times compared with the RAM in the existing art. In the storage device provided in the present disclosure, a storage space of the auxiliary storage module is relatively small, and an area occupied by the auxiliary storage module is also relatively small.

Certainly, the present disclosure is not limited thereto, and the main storage modules may also form a three-dimensional array. Specifically, the storage modules may include multiple main storage modules formed as a three-dimensional cube of an M×M×M array and $3×M^2$ auxiliary storage modules of a forward direction in three planes, from a perspective of each coordinate system plane, in an XY plane, the storage modules in each row include M main storage modules and one auxiliary storage module, in an XZ plane, the storage modules in each row include M main storage modules and one auxiliary storage module, and in a YZ plane, the storage modules in each row include M main storage modules and one auxiliary storage module, M is a positive integer not less than 1.

In a fifth aspect of the present disclosure, there is provided an electronic device including the processor chip provided in the fourth aspect of the present disclosure.

Advantages and benefits of the reading method and the writing method have been described in detail above, and thus are not repeated here.

It should be understood by those of ordinary skill in the art that all or some of operations in the method, the system, the functional modules/components in the apparatus disclosed above may be implemented as software, firmware, hardware, or suitable combinations thereof. In a hardware implementation, the division between the functional modules/components stated above does not correspond to the division of physical components; for example, one physical component may have a plurality of functions, or one function or operation may be performed through cooperation of several physical components. Some or all of the physical components may be implemented as software executed by a processor, such as a central processing unit, a digital signal processor or a microprocessor, or may be implemented as hardware, or may be implemented as an integrated circuit, such as an application specific integrated circuit. Such software may be distributed on a computer-readable medium, the computer-readable medium may include computer storage medium (or non-transitory medium) and communication medium (or transitory medium). The computer storage medium includes volatile/nonvolatile or removable/non-removable medium used in any method or technology for storing information (such as computer-readable instructions, data structures, program modules and other data). The computer storage medium includes, but is not limited to, a Random Access Memory (RAM), a Read-Only Memory (ROM), an Electrically Erasable Programmable Read-Only Memory (EEPROM), a flash memory or other memory techniques, a Compact Disc Read-Only Memory (CD-ROM), a Digital Video Disk (DVD) or other optical discs, magnetic cassettes, magnetic tapes, magnetic disks or other magnetic storage devices, or any other medium which can be used to store the desired information and can be accessed by a computer. The communication medium generally includes computer-readable instructions, data structures, program modules or other data in a modulated data signal, such as a carrier wave or other transmission mechanism, and may include any information delivery medium.

The present disclosure discloses the exemplary implementations, and although specific terms are employed, they are used and should only be interpreted in a generic and descriptive meaning but not for purposes of a limitation. It is apparent to those skilled in the art that features, characteristics and/or elements described in connection with specific implementations may be used alone or in combination with features, characteristics and/or elements described in connection with other implementations, unless explicitly stated otherwise. Therefore, it should be understood by those skilled in the art that various changes in form and details may be made without departing from the scope of the present disclosure as set forth in the appended claims.

What is claimed is:

1. A writing method for writing data into a storage device, the storage device comprises a plurality of storage modules comprising multiple main storage modules and at least one auxiliary storage module, the main storage modules comprise at least one target main storage module and at least one other main storage module, the at least one target main storage module corresponds to the at least one auxiliary storage module, and the method comprises:
  writing writing-table data, to be written, into each one of the multiple main storage modules corresponding to the writing-table data;
  performing a calculation by using a first predetermined algorithm on writing-table data in the at least one target main storage module to obtain at least one auxiliary value, wherein, for the at least one target main storage module, the first predetermined algorithm being used for performing a calculation on writing-table data stored in the at least one target main storage module and writing-table data stored in the at least one other main storage module, an inverse operation of the first predetermined algorithm being used for performing a calculation on the at least one auxiliary value to obtain writing-table data participating in the calculation of the at least one auxiliary value; and
  storing the at least one auxiliary value into the at least one auxiliary storage module corresponding thereto,
  wherein the at least one target storage module comprises more than one target storage modules, after all target main storage modules are subjected to the calculation by using the first predetermined algorithm, all data stored in all the main storage modules participate in the calculation,
  wherein the storage modules are formed as an N×N array, and for the storage modules in previous (N−1) rows, the (N−1) rows are previous to row N, the storage modules in each row comprises N−1 main storage modules and one auxiliary storage module, the storage modules in $N^{th}$ row comprises N auxiliary storage modules, N is a positive integer not less than 3, and the at least one auxiliary value comprises a first auxiliary value, a second auxiliary value and a third auxiliary value,
  performing the calculation by using the first predetermined algorithm on writing-table data in the at least one target main storage module to obtain the at least one auxiliary value, comprises:
  performing a calculation by using the first predetermined algorithm on writing-table data stored in one of a plurality of addresses in one of the target main storage modules and writing-table data stored in corresponding addresses in all other main storage modules located in the same row as the one target main storage module, so as to obtain the first auxiliary value;
  performing a calculation by using the first predetermined algorithm on the writing-table data stored in the one address in the one target main storage module and writing-table data stored in corresponding addresses in all other main storage modules located in the same column as the one target main storage module, so as to obtain the second auxiliary value; and
  performing a calculation by using the first predetermined algorithm on the writing-table data stored in the one address in the one target main storage module, writing-table data stored in corresponding addresses in all main storage modules other than the one target main storage module, and writing-table data stored in corresponding addresses in all auxiliary storage modules other than the auxiliary storage module corresponding to the one target main storage module, so as to obtain the third auxiliary value,
  wherein the first auxiliary value is stored in the auxiliary storage module located in the same row as the current target main storage module, and the second auxiliary value is stored in the auxiliary storage module located in the same column as the current target main storage module, the third auxiliary value is stored in the storage module in $N^{th}$ row and $N^{th}$ column.

2. The writing method of claim 1, wherein in the array, all the main storage modules in a first row are target main storage modules, and all the main storage modules in a first column are target main storage modules.

3. The writing method of claim 1, wherein identification information of addresses corresponding to all writing-table data participating in the same calculation using the first predetermined algorithm are the same.

4. The writing method of claim 1, wherein the first predetermined algorithm is an exclusive OR operation.

5. The writing method of claim 1, wherein in response to writing-table data stored in the main storage module participating in the calculation being changed, the writing method further comprises:
  recalculating, using changed writing-table data to participate in the calculation to obtain a corresponding auxiliary value; and
  replacing the auxiliary value stored in a corresponding address by the auxiliary value obtained by recalculating.

6. A non-transitory computer-readable storage medium having stored an executable program thereon, the executable program, in response to being executed by a processor, causes the processor to implement the writing method of claim 1.

7. A processor chip, comprising a calculation module,
  the calculation module comprises a storage component and a processing component, the storage component having stored an executable program thereon, the executable program, in response to being executed by the processing component, causes the processing component to implement the writing method for writing data into the storage device as claimed in claim 1;
  the processor chip further comprising the storage device having at least one writing port and multiple reading ports;
  the storage device comprises a plurality of storage modules comprising a first writing port, multiple first reading ports, multiple main storage modules, and at least one auxiliary storage module, the at least one auxiliary storage module corresponds to a predetermined number of main storage modules, each main storage module corresponds to the at least one auxiliary storage module, and each storage module is provided with one reading port and one writing port.

8. The processor chip of claim 7, wherein a storage depth of each one of the multiple main storage modules is same as a storage depth of the at least one auxiliary storage module.

9. The processor chip of claim 7, wherein the main storage modules are formed into an N×N array, and for the storage modules in previous (N−1) rows, the (N−1) rows are previous to row N, the storage modules in each row comprise N−1 main storage modules and one auxiliary storage module, the storage modules in $N^{th}$ row comprise N auxiliary storage modules, N is a positive integer not less than 3.

10. The processor chip of claim 9, wherein N is equal to 5, the storage device is provided with four reading ports, a storage depth of each main storage module is one-sixteenth of a total storage depth of all main storage modules.

11. The processor chip of claim 7, wherein the storage modules comprise multiple main storage modules formed as a three-dimensional cube of an M×M×M array and 3×$M^2$ auxiliary storage modules of a forward direction in three planes, from a perspective of each coordinate system plane, in an XY plane, the storage modules in each row comprise M main storage modules and one auxiliary storage module, in an XZ plane, storage modules in each row comprise M main storage modules and one auxiliary storage module, in a YZ plane, the storage modules in each row comprise M main storage modules and one auxiliary storage module, wherein M is a positive integer not less than 1.

12. An electronic device, comprising the processor chip of claim 7.

13. A reading method for reading data from a storage device, the storage device comprises a plurality of storage modules comprising multiple main storage modules and at least one auxiliary storage module, the main storage modules comprise at least one target main storage module and at least one other main storage module, the at least one target main storage module corresponds to the at least one auxiliary storage module, the storage device stores therein data written by writing writing-table data, to be written, into each one of the multiple main storage modules corresponding to the writing-table data, performing a calculation by using a first predetermined algorithm on writing-table data in the at least one target main storage module to obtain at least one auxiliary value, with the first predetermined algorithm being used for performing a calculation on writing-table data stored in the at least one target main storage module and writing-table data stored in the at least one other main storage module, an inverse operation of the first predetermined algorithm being used for performing a calculation on the at least one auxiliary value to obtain writing-table data participating in the calculation of the at least one auxiliary value, and storing the at least one auxiliary value into the at least one auxiliary storage module corresponding thereto, the reading method comprises:
    receiving at least one reading instruction;
    determining a position of writing-table data to be read according to the reading instruction;
    in response to data to be read by at least two reading instructions being stored in a same one of the main storage modules, and addresses pointed by the reading instructions correspond to auxiliary values, for the at least two reading instructions, the reading method further comprises:
    for one of the at least two instructions, directly reading corresponding writing-table data from the main storage module;
    for any other of the at least two instructions, respectively reading the auxiliary value stored in a corresponding address in the at least one auxiliary storage module corresponding to the main storage module and writing-table data in corresponding addresses in main storage modules participating in a calculation of the auxiliary value; and
    performing a calculation on each auxiliary value by using a second predetermined algorithm and each writing-table data to obtain writing-table data stored in an address corresponding to the other instruction in the main storage module, wherein the second predetermined algorithm is an inverse operation of a first predetermined algorithm.

14. The reading method of claim 13, wherein the first predetermined algorithm is an exclusive OR operation, and the second predetermined algorithm is an exclusive OR operation.

15. A non-transitory computer-readable storage medium having stored an executable program thereon, the executable program, in response to being executed by a processor, causes the processor to implement the reading method of claim 13.

16. A processor chip, comprising a calculation module,
    the calculation module comprises a storage component and a processing component, the storage component having stored an executable program thereon, the executable program, in response to being executed by the processing component, causes the processing component to implement the reading method for reading data from the storage device as claimed in claim 13,
    the processor chip further comprising the storage device having at least one writing port and multiple reading ports;
    the storage device comprises a plurality of storage modules comprising a first writing port, multiple first reading ports, multiple main storage modules, and at least one auxiliary storage module, the at least one auxiliary storage module corresponds to a predetermined number of main storage modules, each main storage module corresponds to the at least one auxiliary storage module, and each storage module is provided with one reading port and one writing port.

17. A writing method for writing data into a storage device, the storage device comprises a plurality of storage modules comprising multiple main storage modules and at least one auxiliary storage module, the main storage modules comprise at least one target main storage module and at least one other main storage module, the at least one target main storage module corresponds to the at least one auxiliary storage module, and the method comprises:
    writing writing-table data, to be written, into each one of the multiple main storage modules corresponding to the writing-table data;
    performing a calculation by using a first predetermined algorithm on writing-table data in the at least one target main storage module to obtain at least one auxiliary value, wherein, for the at least one target main storage module, the first predetermined algorithm being used for performing a calculation on writing-table data stored in the at least one target main storage module and writing-table data stored in the at least one other main storage module, an inverse operation of the first predetermined algorithm being used for performing a calculation on the at least one auxiliary value to obtain writing-table data participating in the calculation of the at least one auxiliary value; and
    storing the at least one auxiliary value into the at least one auxiliary storage module corresponding thereto,
    wherein the at least one target storage module comprises more than one target storage modules, after all target main storage modules are subjected to the calculation by using the first predetermined algorithm, all data stored in all the main storage modules participate in the calculation,
    wherein the storage modules comprise multiple main storage modules formed as a three-dimensional cube of an M×M×M array and 3×$M^2$ auxiliary storage modules of a forward direction in three planes, from a perspective of each coordinate system plane, in an XY plane, the storage modules in each row comprise M main storage modules and one auxiliary storage module, in an XZ plane, the storage modules in each row comprise M main storage modules and one auxiliary storage module, and in a YZ plane, the storage modules in each row comprise M main storage modules and one auxiliary storage module, wherein M is a positive integer not less than 1, the at least one auxiliary value comprises a first auxiliary value, a second auxiliary value, and a third auxiliary value;

performing the calculation by using a first predetermined algorithm on writing-table data in at least one target main storage module to obtain the at least one auxiliary value, comprises:

performing a calculation by using the first predetermined algorithm on writing-table data stored in one of a plurality of addresses in one of the target main storage modules and writing-table data stored in corresponding addresses in all other main storage modules located in the same row in the XY plane as the one target main storage module, so as to obtain the first auxiliary value;

performing a calculation by using the first predetermined algorithm on the writing-table data stored in the one address in the one target main storage module and writing-table data stored in corresponding addresses in all other main storage modules located in the same row in the XZ plane as the one target main storage module, so as to obtain the second auxiliary value; and performing a calculation by using the first predetermined algorithm on the writing-table data stored in the one address in the one target main storage module and writing-table data stored in corresponding addresses in all other main storage modules located in the same row in the YZ plane as the one target main storage module, so as to obtain the third auxiliary value, wherein the first auxiliary value is stored in the auxiliary storage module located in the same row in the XY plane as the one target main storage module, and the second auxiliary value is stored in the auxiliary storage module located in the same row in the XZ plane as the one target main storage module, the third auxiliary value is stored in the auxiliary storage module located in the same row in the YZ plane as the one target main storage module.

* * * * *